United States Patent [19]

Ueno

[11] Patent Number: 4,783,604
[45] Date of Patent: Nov. 8, 1988

[54] BUFFER CIRCUIT FOR OUTPUTTING SIGNALS OF DIFFERENT POLARITIES

[75] Inventor: Masaji Ueno, Yokohama, Japan

[73] Assignee: Kabushiki Kaisha Toshiba, Kawasaki, Japan

[21] Appl. No.: 15,038

[22] Filed: Feb. 17, 1987

[30] Foreign Application Priority Data

Mar. 31, 1986 [JP] Japan .................. 61-72904

[51] Int. Cl.$^4$ .................. H03K 6/02; H03K 3/353; H03K 17/10; H03K 17/687
[52] U.S. Cl. .................. 307/446; 307/570; 307/443; 307/269
[58] Field of Search .................. 307/590, 594, 600, 605, 307/600, 570, 572, 577, 579, 585, 446, 443, 268, 269

[56] References Cited

U.S. PATENT DOCUMENTS

| | | | |
|---|---|---|---|
| 4,291,247 | 9/1981 | Cooper, Jr. et al. | 307/443 X |
| 4,479,216 | 10/1984 | Krambeck et al. | 307/269 X |
| 4,495,426 | 1/1985 | Leach | 307/269 X |
| 4,618,786 | 10/1986 | Johnson | 307/269 X |
| 4,625,126 | 11/1986 | Tinker et al. | 307/269 X |
| 4,649,295 | 3/1987 | McLaughlin et al. | 307/443 X |
| 4,678,940 | 7/1987 | Vasseghi et al. | 307/446 |
| 4,694,203 | 9/1987 | Uragami et al. | 307/443 X |
| 4,701,642 | 10/1987 | Pricer | 307/446 |

Primary Examiner—John S. Heyman
Assistant Examiner—David R. Bertelson
Attorney, Agent, or Firm—Finnegan, Henderson, Farabow, Garrett & Dunner

[57] ABSTRACT

A buffer circuit comprises first to third CMOS inverters whose input terminals are mutually connected, first and second npn transistors whose bases are commonly connected to an output terminal of the first CMOS inverter and whose emitters are respectively connected to output terminals of the second and third CMOS inverters, fourth and fifth CMOS inverters for inverting the output signals of the first and third CMOS inverters, a third npn transistor whose base and emitter are respectively connected to output terminals of the fourth and fifth CMOS inverters, fourth and fifth npn transistors whose conduction states are controlled by the output signals of the first and fourth CMOS inverters, first and second n-channel MOS transistors which are serially connected to the fourth and fifth npn transistors, respectively, and whose gates are respectively connected to the third and fifth CMOS inverters, and third and fourth n-channel MOS transistors which are respectively connected between the gates of the first and second n-channel MOS transistors and a reference voltage terminal and whose gates are respectively connected to the fourth and first CMOS inverters.

10 Claims, 4 Drawing Sheets

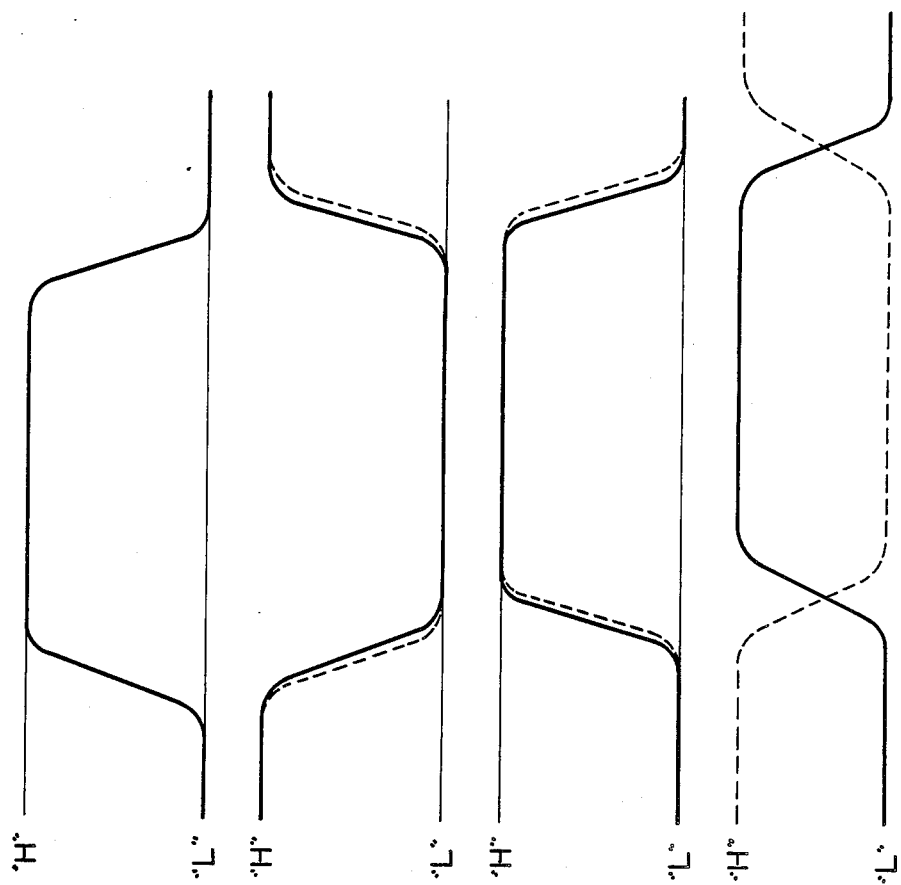

BUFFER CIRCUIT FOR OUTPUTTING SIGNALS OF DIFFERENT POLARITIES

BACKGROUND OF THE INVENTION

The present invention relates to a buffer circuit for generating signals of the same and opposite polarities with respect to that of the input signal.

Hitherto, in the case of obtaining two output signals having different polarities, for example, as shown in FIG. 1, a buffer circuit using two CMOS inverter circuits is used. Namely, an input signal $D_{in}$ is supplied to and inverted by a first inverter circuit 11 from which, an output $\overline{D_{out}}$ is generated as a first signal, and the output of inverter circuit 11 is inverted by a second inverter circuit 12, thereby causing an output $D_{out}$ of the same polarity as input signal $D_{in}$ to be generated as a second signal.

Suppose that inverter circuits 11 and 12 are constituted by CMOS circuits and the transfer delay times by inverter circuits 11 and 12 respectively assume $t_{pdA}$ and $t_{pdB}$. Then, delay times 66 $\overline{D_{out}}$ and $\Delta D_{out}$ of output signals $\overline{D_{out}}$ and $D_{out}$ for input signal $D_{in}$ will become equal to $t_{pdA}$ and ($t_{pdA}+t_{pdB}$), respectively. Therefore, there is a drawback that the time difference equal to transfer delay time $t_{pdB}$ due to the presence of inverter circuit 12 occurs between output signals $\overline{D_{out}}$ and $D_{out}$.

As mentioned above, the time difference corresponding to the delay time of the CMOS inverter circuit of the post stage occurs between the outputs of both polarities in the conventional CMOS buffer circuits to obtain the outputs of both polarities.

SUMMARY OF THE INVENTION

It is an object of the present invention to provide a buffer circuit which can reduce the skew of the delay time between the output signals of both polarities.

This object is accomplished by a buffer circuit comprising: first and second power source terminals and first and second output nodes; a first delay circuit for receiving an input signal and generating inverted signals of the input signal from first, second, and third output terminals; a second delay circuit for receiving the signals from the first and third output terminals of the first delay circuit and generating inverted signals of the received signals from first and second output terminals; first and second bipolar transistors whose bases are commonly connected to the first output terminal of the first delay circuit and which are connected at one end to the first power source terminal and respectively connected at the other end to the second and third output terminals of the first delay circuit; a third bipolar transistor whose base is connected to the first output terminal of the second delay circuit and which is connected at one end to the first power source terminal and connected at the other end to the second output terminal of the second delay circuit; first and second bipolar transistor circuits which are respectively connected between the first power source terminal and the first and second output nodes and are controlled to be set in the opposite conduction states in response to the output signals from the first output terminal of the second delay circuit and from the first output terminal of the first delay circuit, respectively; first and second MOS transistors which are respectively connected between the first and second output nodes and the second power source terminal and are controlled to be set in the opposite conduction states in response to the output signals from the third output terminal of the first delay circuit and from the second output terminal of the second delay circuit, respectively; and third and fourth MOS transistors which are respectively connected between the gates of the first and second MOS transistors and the second power source terminal and are respectively controlled to be set in the opposite conduction states in response to the output signals from the first output terminal of the second delay circuit and from the second output terminal of the first delay circuit, wherein output signals having the inversion relation are generated from the first and second output nodes in response to the input signal.

BRIEF DESCRIPTION OF THE DRAWINGS

FIGS. 5A to 5D are signal waveform diagrams for explaining the operation of the buffer circuit shown in FIG. 4.

DETAILED DESCRIPTION OF THE PREFERRED EMBODIMENTS

Figure 1:
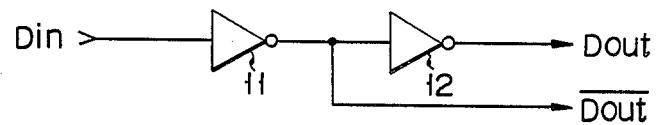
FIG. 1 shows a conventional buffer circuit having two inverters.

An embodiment of the present invention will be described hereinbelow with reference to the drawings. Input signal $D_{in}$ is supplied to the input terminal of inverter circuit 13 shown in FIG. 2. The output of inverter circuit 13 is supplied to the input terminal of inverter circuit 14. The output of inverter circuit 14 is supplied to the base of NPN-type bipolar transistor 15 whose collector is connected to power source VC. N-channel type MOS transistor 16 is connected between the emitter of bipolar transistor 15 and the ground. The output of inverter circuit 13 is supplied to the gate of MOS transistor 16. Current control circuit $CC_1$ and overcurrent inhibit circuit $IC_1$, which are respectively controlled by the outputs of inverter circuits 13 and 14, are connected between the drain of MOS transistor 16 and the ground. The output of inverter circuit 13 is also supplied to the base of NPN-type bipolar transistor 18 whose collector is connected to power supply VC. N-channel type MOS transistor 19 is connected between the emitter of bipolar transistor 18 and the ground. The output of inverter circuit 14 is supplied to the gate of MOS transistor 19. Current control circuit $CC_2$ and overcurrent inhibit circuit $IC_2$ are connected between the drain of MOS transistor 19 and the ground and are controlled by the outputs of inverter circuits 14 and 13, respectively. Output signal $D_{out}$ is obtained from the node of bipolar transistor 15 and MOS transistor 16 through a load circuit having a capacitor $C_1$ and a resistor $R_1$. Output signal $\overline{D_{out}}$ is obtained from the node of bipolar transistor 18 and MOS transistor 19 through a load circuit having a capacitor $C_2$ and a resistor $R_2$.

In the foregoing constitution, the schematic operation will now be described. When input signal $D_{in}$ which is supplied to inverter circuit 13 changes from an "L" level to an "H" level as shown in FIG. 3A, the output changes to an "L" level after the delay time caused by inverter circuit 13 as shown in FIG. 3B.

Thus, bipolar transistor 18 and MOS transistor 16 change from the ON state to the OFF state. In this case, however, since it takes a time until MOS transistor 16 is completely turned off, output signal $D_{out}$ is substantially held at an "L" level at this time, as shown in FIG. 3D. Next, the output of inverter circuit 14 is set to an "H" level after a predetermined delay time as shown in FIG. 3C, so that bipolar transistor 15 and MOS transistor 19 change from the OFF state to ON state. At this time, overcurrent inhibit circuit $IC_1$ is made operative by the "H" level signal which is output from inverter circuit 14, thereby connecting the gate of MOS transistor 16 to the ground. Therefore, output signals $D_{out}$ and $\overline{D_{out}}$ are set to "H" and "L" levels in response to the output signal from inverter circuit 14, as shown in FIGS. 3D and 3E, respectively.

Figure 3:
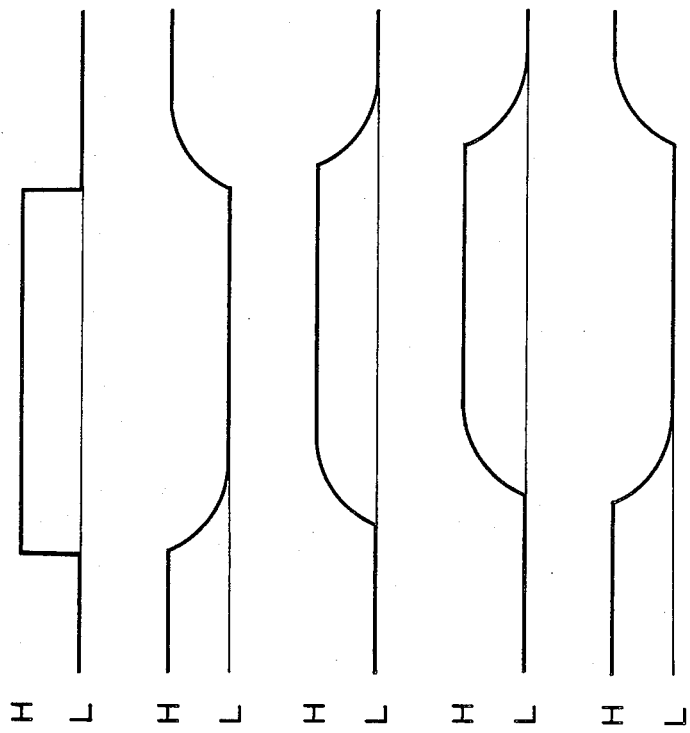
FIGS. 3A to 3E are signal waveform diagrams for explaining the operation of a buffer circuit shown in FIG. 2.

Next, when input signal $D_{in}$ changes from an "H" level to an "L" level, as shown in FIG. 3A, the output of inverter circuit 13 is inverted and is set to an "H" level, as shown in FIG. 3B. Thus, bipolar transistor 18 is turned on. In this case, the gate of MOS transistor 19 is grounded by overcurrent inhibit circuit $IC_2$ and MOS transistor 19 is gradually turned towards the OFF state. In this case, since the gate of MOS transistor 16 is grounded by overcurrent inhibit circuit $IC_1$, MOS transistor 16 is held in the OFF state. Namely, output signal $D_{out}$ is held at an "H" level as shown in FIG. 3D. Next, when the output of inverter circuit 14 is inverted from an "H" level to an "L" level, as shown in FIG. 3C, MOS transistor 19 is turned off and bipolar transistor 15 is turned off and overcurrent inhibit circuit $IC_1$ is made inoperative. MOS transistor 16 is turned on by the "H" level output of inverter circuit 13. Therefore, output signals $D_{out}$ and $\overline{D_{out}}$ are set to "L" and "H" levels in response to the output signal of inverter circuit 14, respectively.

With this constitution, such an effect that the skew between output signals $D_{out}$ and $\overline{D_{out}}$ can be reduced is obtained.

Figure 4:
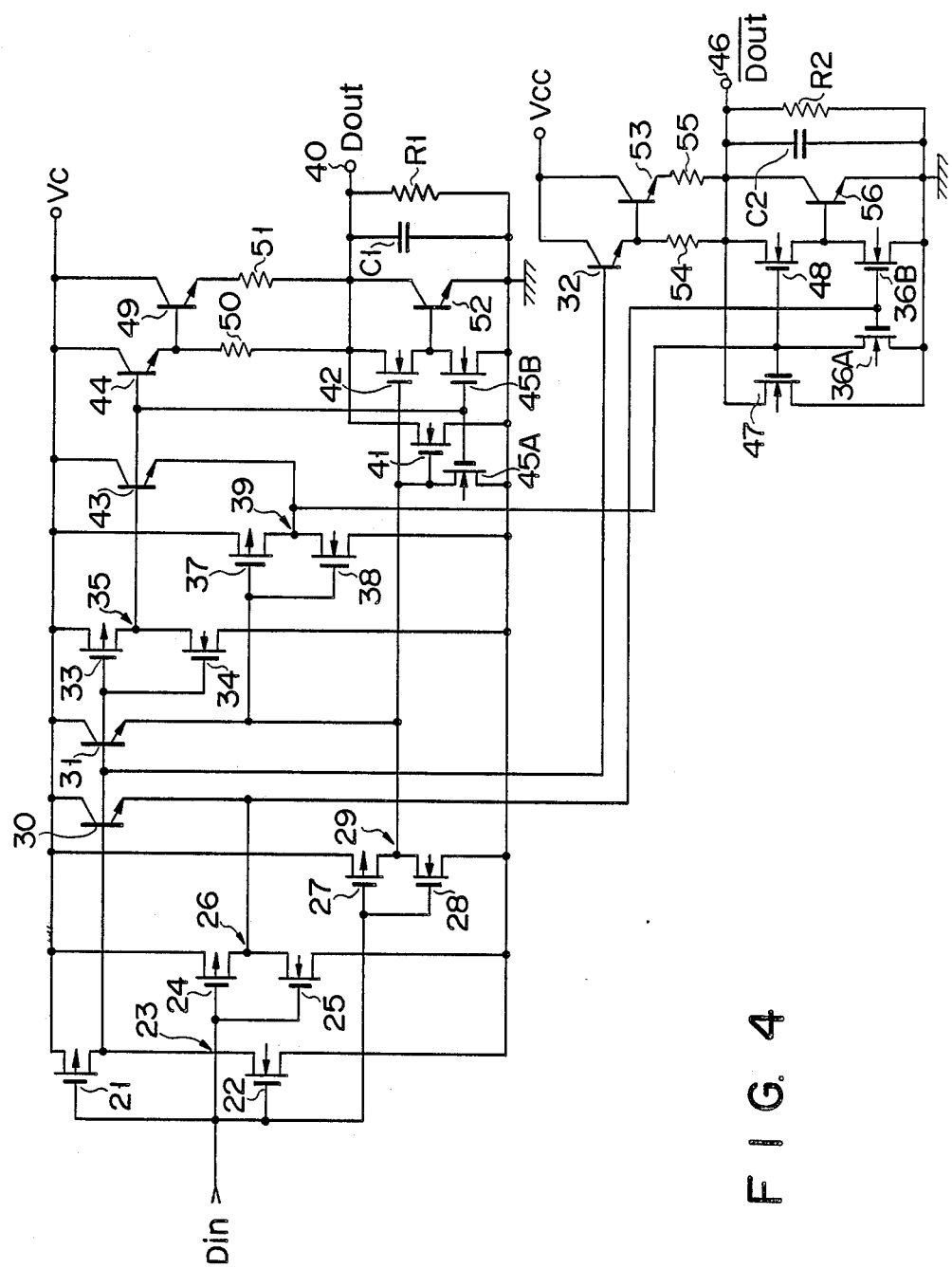
FIG. 4 is a circuit diagram showing a practical buffer circuit of the circuit of FIG. 2.

This effect will now be described in detail hereinbelow with reference to FIG. 4 showing a practical constitutional example of the circuit of FIG. 2. In FIG. 4, input signal $D_{in}$ is supplied to each input terminal of CMOS inverter 23 including P-channel type MOS transistor 21 and N-channel type MOS transistor 22, CMOS inverter 26 including P-channel type MOS transistor 24 and N-channel type MOS transistor 25, and CMOS inverter 29 including P-channel type MOS transistor 27 and N-channel type MOS transistor 28. The output terminal of CMOS inverter 23 is connected to the bases of NPN-type bipolar transistors 30 to 32 whose collectors are connected to power source VC and also to the gates of P-channel type MOS transistor 33 and N-channel type MOS transistor 34 which constitute CMOS inverter 35. The emitter of bipolar transistor 30 and the gates of N-channel type MOS transistors 36A and 36B, grounded at one end, are connected to the output terminal of CMOS inverter 26. The emitter of bipolar transistor 31, the gates of P-channel type MOS transistor 37 and N-channel type MOS transistor 38 which constitute CMOS inverter 39, the gate of N-channel type MOS transistor 41 connected between output terminal 40 and the ground, and the gate of N-channel type MOS transistor 42 which is connected at one end to output terminal 40 are connected to the output terminal of CMOS inverter 29. The bases of NPN-type bipolar transistors 43 and 44, whose collectors are connected to power source VC and the gates of N-channel type MOS transistors 45A and 45B, are connected to the output terminal of CMOS inverter 35. MOS transistor 45A is connected between the gate of MOS transistor 41 and the ground. MOS transistor 45B is connected between the other end of MOS transistor 42 and the ground. The emitter of bipolar transistor 43, the gate of N-channel type MOS transistor 47 connected between an output terminal 46 and the ground, and the gates of N-channel type MOS transistor 48 connected between the other end of MOS transistor 36 and output terminal 46 are connected to the output terminal of CMOS inverter 39. The base of NPN-type bipolar transistor 49, whose collector is connected to power source VC, is connected to the emitter of bipolar transistor 44. Output terminal 40 is also connected to the emitter of bipolar transistor 44 through resistor 50. Output terminal 40 is connected to the emitter of bipolar transistor 49 through resistor 51. The collector-emitter path of NPN-type bipolar transistor 52 is connected between output terminal 40 and the ground. The node of MOS transistors 42 and 45 is connected to the base of bipolar transistor 52.

The base of NPN-type bipolar transistor 53 whose collector is connected to power source VC is connected to the emitter of bipolar transistor 32. Output terminal 46 is also connected to the emitter of bipolar transistor 32 through resistor 54. Output terminal 46 is connected to the emitter of bipolar transistor 53 through resistor 55. The collector-emitter path of an NPN-type bipolar transistor 56 is connected between output terminal 46 and the ground. The node of MOS transistors 48 and 36 is connected to the base of bipolar transistor 56. Output signal $D_{out}$, having the same phase as input signal $D_{in}$, is obtained from output terminal 40 through a load circuit including, for example, capacitor $C_1$ of 50 pF and resistor $R_1$ of 500Ω. Output signal $D_{out}$ having the phase opposite to that of input signal $D_{in}$ is derived from output terminal 46 through a load circuit including, for example, capacitor $C_2$ of 50 pF and resistor $R_2$ of 500Ω.

Figure 2:
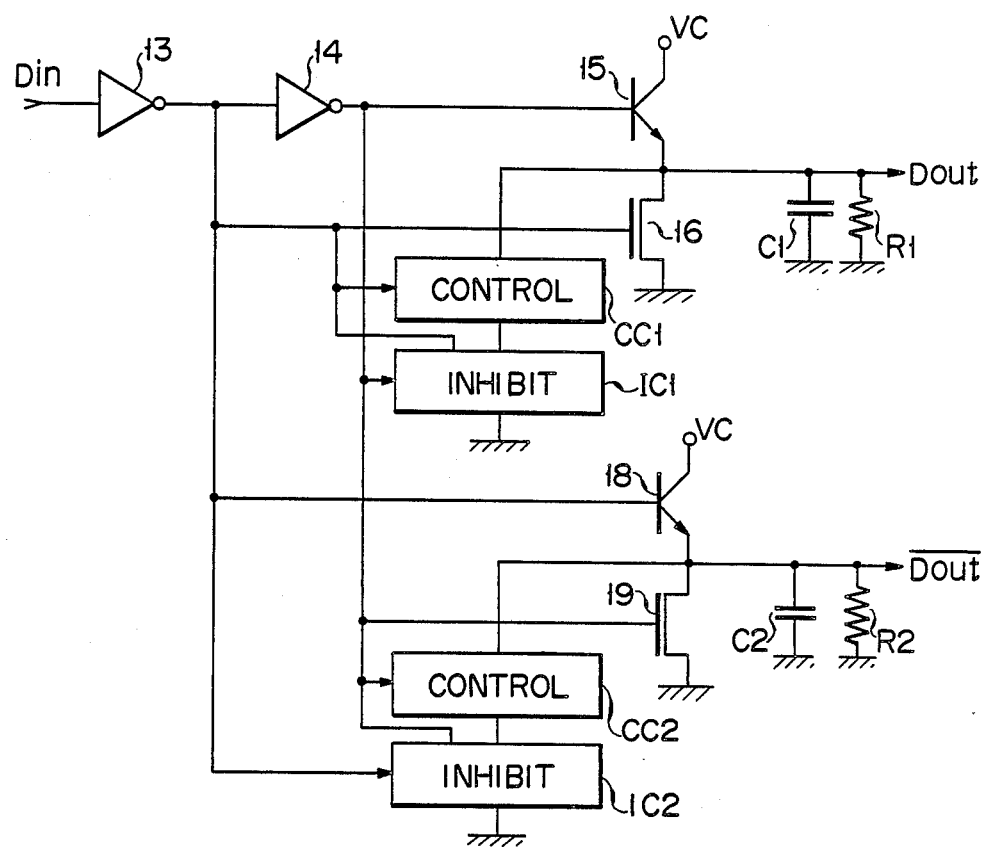
FIG. 2 is a schematic circuit diagram of a buffer circuit according to an embodiment of the present invention.

CMOS inverters 23, 26, and 29 and bipolar transistors 30 and 31 correspond to inverter circuit 13 in FIG. 2. CMOS inverters 35 and 39 and bipolar transistor 43 correspond to inverter circuit 14. MOS transistors 45A and 45B constitute overcurrent inhibit circuit 17. MOS transistors 36A and 36B constitute overcurrent inhibit circuit 20. Further, in the circuit of FIG. 4, bipolar transistors 15 and 18 of the output stage in FIG. 2 are replaced by Darlington-connected bipolar transistors 44 and 49 and by Darlington-connected bipolar transistors 32 and 53, respectively. MOS transistors 16 and 19 of the output stage are replaced by MOS transistors 41 and 47. Further, current control circuits $CC_1$ and $CC_2$ in FIG. 2 are constituted by MOS transistor 42 and bipolar transistor 52, and by MOS transistor 48 and bipolar transistor 56, respectively. The areas of the gates of MOS transistors 41 and 47 are set to values which are tens of times as large as those of MOS transistors 42 and 48.

In the foregoing constitution, when input signal $D_{in}$ changes to an "H" level, as shown in FIG. 5A, the outputs of CMOS inverters 23, 26, and 29 change to an "L" level. In FIG. 5B, the output of CMOS inverter 23 is indicated by a solid line and the outputs of CMOS inverters 26 and 29 are shown by broken lines. Therefore, bipolar transistors 30 and 31 are turned off and the emitters of these bipolar transistors are each grounded through MOS transistor 25 or 28, so that MOS transistors 36A, 36B, 41, and 42 are also turned off. The output of CMOS inverter 35 is set to an "H" level, as shown by a solid line in FIG. 5C, by the "L" level output from CMOS inverter 23. The output of CMOS inverter 39 also changes to an "H" level, as shown by a broken line in FIG. 5C, by the "L" level output from CMOS inverter 29. Bipolar transistors 43 and 44 are turned on by the "H" level output from CMOS inverter 35. The emitter potential of bipolar transistor 43 rises to (VC−VBE). Since the emitter of bipolar transistor 43 is connected to power source VC through MOS transistor 37 of CMOS inverter 39, the emitter potential is further raised and set at the VC level. Thus, MOS transistors 47 and 48 are turned on. In this case, however, since it takes a time until MOS transistor is sufficiently turned ON, output signal $\overline{D_{out}}$ is not set at the "L" level at this point in time. Since load capacitor $C_2$ is connected to output terminal 46, a base current is supplied to bipolar transistor 56 from capacitor $C_2$ through MOS transistor 48 in the ON state and bipolar transistor 56 is turned on. At this time, as mentioned above, since bipolar transistor 32 is in the OFF state, bipolar transistor 53 is also in the OFF state. In this manner, output signal $\overline{D_{out}}$ rapidly decreases to the "L" level. In this case, since the charges in capacitor $C_2$ are discharged through MOS transistor 47, output signal $\overline{D_{out}}$ further rapidly increases. When output signal $\overline{D_{out}}$ reaches a preset level, transistor 56 is turned off. However, in this case, MOS transistor 47 is also held in the ON state, thereby reducing output signal $\overline{D_{out}}$ to a sufficiently low level.

On the other hand, as previously mentioned, since MOS transistors 41 and 42 are turned off by the "L" level output from CMOS inverter 29 and bipolar transistor 44 is in the ON state by the "H" level output from CMOS inverter 35, bipolar transistor 49 is in the ON state. At this time, MOS transistor 45A and 45B are turned on by the "H" level output from CMOS inverter 35. MOS transistor 41 and bipolar transistor 52 are turned off. Namely, as shown by a solid line in FIG. 5D, when bipolar transistor 52 is turned off, output signal $\overline{D_{out}}$ rapidly changes toward an "H" level.

When input signal $D_{in}$ changes to the "L" level, as shown in FIG. 5A, the outputs of CMOS inverters 23, 26, and 29 change to the "H" level, as shown in FIG. 5B. Thus, bipolar transistors 30 and 31 are turned on. Therefore, the emitter potentials of bipolar transistors 30 and 31 increase to (VC−VBE). Each emitter of bipolar transistors 30 and 31 is connected to power source VC through MOS transistor 24 or 27, so that the potential is further raised and set at the VC level. Therefore, MOS transistors 36A, 36B, 41, and 42 are turned ON. In this case, since it takes a time until MOS transistor 41 is completely turned ON, output signal $D_{out}$ is not immediately set to the "L" level at this point in time. Bipolar transistors 32 and 53 are sequentially turned on by the "H" level signal, which is output from CMOS inverter 23, and the output of CMOS inverter 35 is set to the "L" level. At this time, the output of CMOS inverter 39 is also set to the "L" level by the "H" level signal which is output from CMOS inverter 29. Therefore, bipolar transistors 43, 44, and 49 are turned off and MOS transistors 45A and 45B are set into the OFF state. MOS transistors 47 and 48 are also set into the OFF state. Since load capacitor $C_1$ is connected to output terminal 40, a base current is supplied to bipolar transistor 52 through MOS transistor 42 set in the ON state, and bipolar transistor 52 is turned ON. Therefore, output signal $D_{out}$ rapidly changes to the "L" level, as shown by a solid line in FIG. 5D.

In addition, since bipolar transistor 56 is turned off owing to the OFF state of MOS transistor 48 and the ON state of MOS transistors 36A and 36B, output signal $\overline{D_{out}}$ rapidly changes toward the "H" level, as shown by a broken line in FIG. 5D.

As described above, when input signal $D_{in}$ changes to the "H" level, output signal Dout starts rising when the output signal from CMOS inverter 35 reaches a predetermined value. Further, when MOS transistor 41 and bipolar transistor 52 are turned OFF, output signal $D_{out}$ rapidly decreases. In this case, output signal $\overline{D_{out}}$ starts decreasing when the output of CMOS inverter 23 reaches a predetermined value and bipolar transistors 32 and 53 are turned on. Further, when MOS transistor 47 and bipolar transistor 56 are turned ON by MOS transistors 36A and 36B which are turned OFF in response to the output of CMOS inverter 26, output signal $\overline{D_{out}}$ rapidly increases.

The periods of time after input signal $D_{in}$ reached a predetermined voltage of, e.g., 1.5 V from the "L" level (e.g., 0 V) until output signals $D_{out}$ and $\overline{D_{out}}$ change to the predetermined voltage level from "L" and "H" levels (e.g., 0 V and 3.5 V), respectively, can be made substantially equal to each other by properly selecting the ratio of the sizes of MOS transistors 41, 42, 47, and 48.

In the case where input signal $D_{in}$ changes to the "L" level, when bipolar transistors 44 and 49 and MOS transistors 45A and 45B start changing to the OFF state by the output signal from CMOS inverter 35, output signal $D_{out}$ starts decreasing. Thereafter, when bipolar transistor 52 is turned ON, output signal $D_{out}$ promptly decreases. In this case, when the output signal of CMOS inverter 23 increases to a predetermined value and bipolar transistors 32 and 53 are turned ON, output signal $D_{out}$ starts increasing. Thereafter, as MOS transistor 47 and bipolar transistor 56 change to the OFF state, output signal $D_{out}$ promptly rises.

The periods of time after input signal $D_{in}$ decreased to a predetermined voltage of, e.g., 1.5 V from an "H" level (e.g., 5 V) until output signals $D_{out}$ and $D_{out}$ change to the predetermined voltage level from "H" and "L" levels, respectively, can be made substantially equal to each other by properly selecting the ratio of the sizes of MOS transistors 41, 42, 47, and 48.

What is claimed is:

1. A buffer circuit comprising:
   first and second power source terminals and first and second output nodes;
   a first delay circuit for receiving on input signal and generating an inverted signal of said input signal from first, second and third output terminals;
   a second delay circuit for receiving the signals from said first and third output terminals of said first delay circuit and generating inverted signals of these signals from first and second output terminals;
   first and second bipolar transistors having bases commonly connected to the first output terminal of said first delay circuit and which are connected at one end to the first power source terminal and respectively connected at the other end to the second and third output terminals of said first delay circuit.
   a third bipolar transistor having a base connected to the first output terminal of said second delay circuit and which is connected at one end to the first power source terminal and connected at the other end to the second output terminal of said second delay circuit;

first and second bipolar transistor circuits which are respectively connected between said first power source terminal and the first and second output nodes and are controlled to be set into opposite conduction states in response to the output signals from the first output terminal of said second delay circuit and from the first output terminal of the first delay circuit, respectively;

first and second MOS transistors which are respectively connected between the first and second output nodes and said second power source terminal and are controlled to be set into the opposite conduction states in response to the output signals from the third output terminal of said first delay circuit and from the second output terminal of said second delay circuit, respectively; and third and fourth MOS transistors which are respectively connected between the gates of said first and second MOS transistors and said second power source terminal and are respectively controlled to be set into the opposite conduction states in response to the output signals from the first output terminal of said second delay circuit and from the second output terminal of said first delay circuit.

wherein output signals in the inversion relation are generated from said first and second output nodes in response to said input signal.

2. A buffer circuit according to claim 1, wherein said first delay circuit has first, second, and third CMOS inverters for inverting said input signal and generating output signals from said first, second, and third output terminals thereof, respectively.

3. A buffer circuit according to claim 2, wherein said second delay circuit includes a fourth CMOS inverter for inverting the output signal from the first output terminal of said first delay circuit and generating an output signal from the first output terminal thereof and a fifth CMOS inverter for inverting the output signal from the third output terminal of said first delay circuit and generating an output signal from the second output terminal thereof.

4. A buffer circuit according to claim 3, further comprising fourth and fifth bipolar transistors which are respectively connected between the first and second output nodes and the second power source terminal, fifth and sixth MOS transistors which are respectively connected between the base of said fourth bipolar transistor on one hand and said first output node and the second power source terminal on the other, and seventh and eighth MOS transistors which are respectively connected between the base of said fifth bipolar transistor on one hand and said second output node and the second power source terminal on the other, and wherein the gates of said sixth, fifth, eighth, and seventh MOS transistors are respectively connected to the third output terminal of said first delay circuit, the first and second output terminals of said second delay circuit, and the second output terminal of said first delay circuit.

5. A buffer circuit according to claim 4, wherein each of said first and second bipolar transistor circuits has two bipolar transistors which are Darlington-connected.

6. A buffer circuit according to claim 2, further comprising fourth and fifth bipolar transistors which are respectively connected between the first and second output nodes and the second power source terminal, fifth and sixth MOS transistors which are respectively connected between the base of said fourth bipolar transistor on one hand and said first output node and the second power source terminal on the other, and seventh and eighth MOS transistors which are respectively connected between the base of said fifth bipolar transistor on one hand and said second output node and the second power source terminal on the other, and wherein the gates of said sixth, fifth, eighth, and seventh MOS transistors are respectively connected to the third output terminal of said first delay circuit, the first and second output terminals of said second delay circuit, and the second output terminal of said first delay circuit.

7. A buffer circuit according to claim 2, wherein each of said first and second bipolar transistor circuits has two bipolar transistors which are Darlington-connected.

8. A buffer circuit according to claim 1, wherein said second delay circuit includes a fourth CMOS inverter for inverting the output signal from the first output terminal of said first delay circuit and generating an output signal from the first output terminal thereof and a fifth CMOS inverter for inverting the output signal from the third output terminal of said first delay circuit and generating an output signal from the second output terminal thereof.

9. A buffer circuit according to claim 1, further comprising fourth and fifth bipolar transistors which are respectively connected between the first and second output nodes and the second power source terminal, fifth and sixth MOS transistors which are respectively connected between the base of said fourth bipolar transistor on one hand and said first output node and the second power source terminal on the other, and seventh and eighth MOS transistors which are respectively connected between the base of said fifth bipolar transistor on one hand and said second output node and the second power source terminal on the other, and wherein the gates of said sixth, fifth, eighth, and seventh MOS transistors are respectively connected to the third output terminal of said first delay circuit, the first and second output terminals of said second delay circuit, and the second output terminal of said first delay circuit.

10. A buffer circuit according to claim 1, wherein each of said first and second bipolar transistor circuits has two bipolar transistors which are Darlington-connected.

* * * * *